US011195693B1

(12) United States Patent
Vystavěl et al.

(10) Patent No.: US 11,195,693 B1
(45) Date of Patent: Dec. 7, 2021

(54) METHOD AND SYSTEM FOR DYNAIC BAND CONTRAST IMAGING

(71) Applicant: FEI Company, Hillsboro, OR (US)

(72) Inventors: Tomáš Vystavěl, Brno (CZ); Pavel Stejskal, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/888,216

(22) Filed: May 29, 2020

(51) Int. Cl.
*H01J 37/28* (2006.01)
*H01J 37/244* (2006.01)
*H01J 37/26* (2006.01)
*H01J 37/22* (2006.01)

(52) U.S. Cl.
CPC ............ *H01J 37/28* (2013.01); *H01J 37/222* (2013.01); *H01J 37/244* (2013.01); *H01J 37/265* (2013.01); *H01J 2237/24475* (2013.01); *H01J 2237/2817* (2013.01)

(58) Field of Classification Search
CPC .. H01J 37/00; H01J 37/02; H01J 37/28; H01J 37/22; H01J 37/222; H01J 37/244; H01J 37/26; H01J 37/265; H01J 37/295; H01J 2237/24475; H01J 2237/2817
USPC .................................. 250/306, 307, 310, 311
See application file for complete search history.

(56) References Cited

U.S. PATENT DOCUMENTS

| 9,618,463 | B2 | 4/2017 | Unčovský | |
|---|---|---|---|---|
| 2002/0161534 | A1* | 10/2002 | Adler | G01N 23/2252 702/35 |
| 2004/0011958 | A1* | 1/2004 | Wright | G01N 23/203 250/307 |
| 2015/0214004 | A1* | 7/2015 | Pavia | H01J 37/295 250/307 |
| 2016/0284507 | A1* | 9/2016 | Pavia | G01N 23/2055 |
| 2019/0318193 | A1 | 10/2019 | Bedell et al. | |

OTHER PUBLICATIONS

Stuart I. Wright, et al, Electron imaging with an EBSD Detector, Ultramicroscopy, Jun. 6, 2014, pp. 132-145, vol. 148, Elsevier B.V.
Stefan Zaefferer et al., Theory and application of electron channelling collrast imaging under controlled diffraction conditions, Acta Materialia, Science Direct, Oct. 1, 2013, pp. 20-50, Elsevier B.V.

\* cited by examiner

*Primary Examiner* — Jason L McCormack

(57) ABSTRACT

Dynamic band contrast image (DBCI) is constructed with scattering patterns acquired at multiple scanning locations of a sample using a charged particle beam. Each pixel of the DBCI is generated by integrating the corresponding scattering pattern along a diffraction band. The DBCI includes charged particle channeling condition and can be used for detecting sample defects.

18 Claims, 7 Drawing Sheets

METHOD AND SYSTEM FOR DYNAMIC BAND CONTRAST IMAGING

FIELD OF THE INVENTION

The present description relates generally to methods and systems for imaging sample with charged particles, and more particularly, to generating a dynamic band contrast image using charged particles.

BACKGROUND OF THE INVENTION

Electron channeling contrast imaging (ECCI) based on backscattered electrons (BSEs) can be used to non-destructively observe crystal defects. The visibility of the defect in ECCI depends on the Burgers vector b of the lattice distortion resulting from a dislocation or stacking faults in the crystal lattice, as well as the diffraction vector g of the crystal. The dislocation is invisible in ECCI if $g \cdot b = g \cdot (b \times u) = 0$, wherein u is the line direction of the dislocation. The ECCI is performed by tilting the sample plane into the Bragg condition, and collecting the BSEs by scanning the sample. The sample may be tilted into the Bragg condition based on a selected area channeling pattern (SACP) generated by rocking the primary beam across pivot points on the sample. Alternatively, the sample may be tilted into the Bragg condition based on orientation information extracted from the electron backscatter diffraction (EBSD). If multiple grains are imaged, the sample has to be tilted into the Bragg condition for each grain. The sample tilting procedure in ECCI imaging is time consuming and may require hardware not available in conventional microscopy systems (such as high precision stage capable of complex stage movements, or column with beam rocking functionality).

SUMMARY

In one embodiment, a method for inspecting sample defect comprises scanning a plurality of scanning locations of the sample with a charged particle beam; forming a plurality of scattering patterns with charged particles emitted from the sample, wherein one scattering pattern is formed at each scanning location of the plurality of scanning locations; determining a location of a diffraction band in the plurality of scattering patterns; and constructing a dynamic band contrast image (DBCI) from the plurality of scattering patterns based on the location of the diffraction band. The DBCI includes the channeling information and can be used for observing the defects. Further, DBCIs of different channeling conditions can be constructed based on the same set of acquired scattering patterns without tilting the sample relative to the incident beam. In this way, sample defects can be quickly and reliably observed with low radiation damage.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

Figure 1:
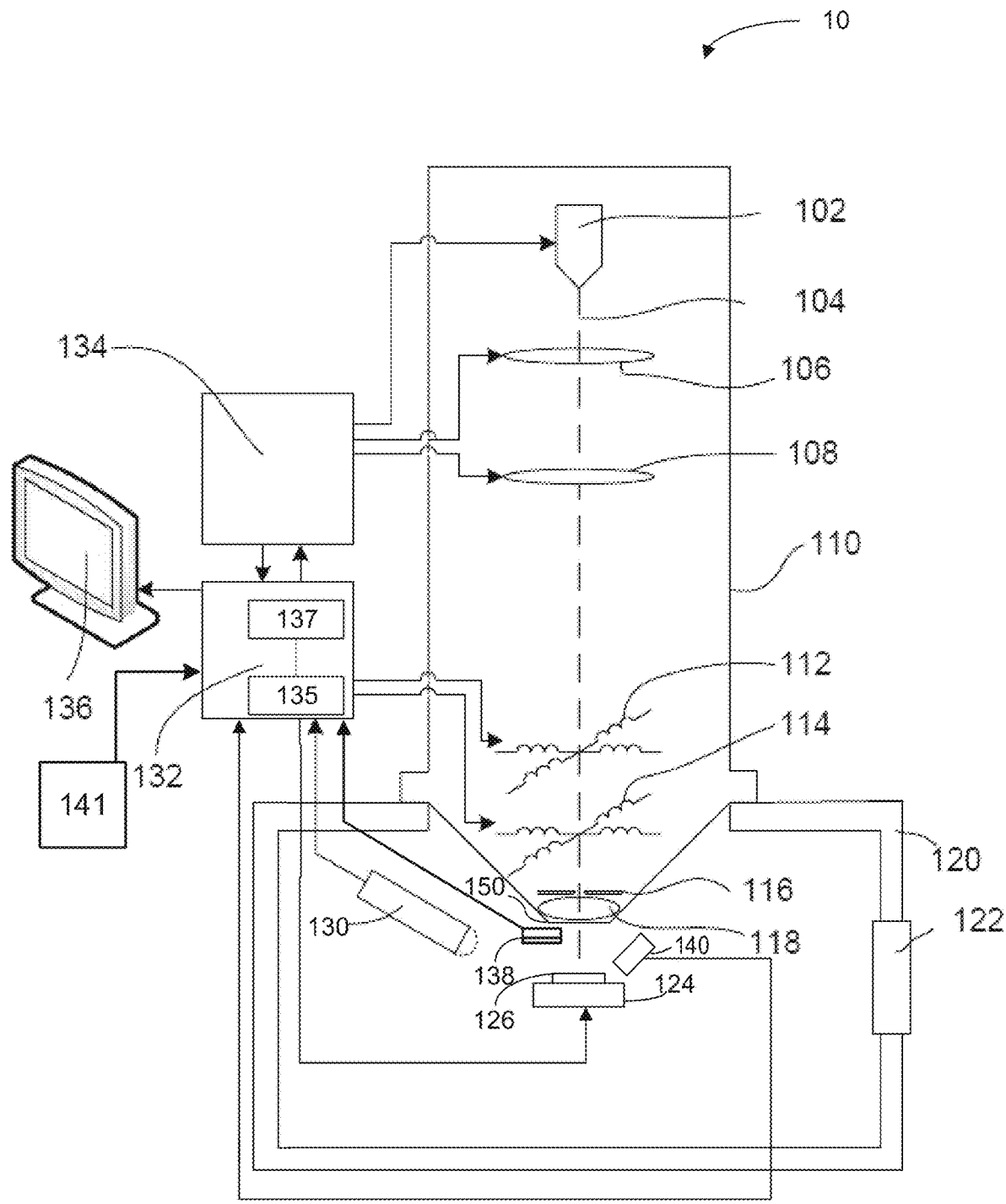
FIG. 1 shows a scanning electron microscopy imaging system for acquiring dynamic band contrast images (DBCIs), according to some embodiments.

The following description relates to systems and methods for generating a dynamic band contrast image (DBCI) using a charged particle imaging system. Responsive to scanning multiple scanning locations of the sample, scattered charged particles emitted from the sample are collected with a position sensitive detector, such as a pixelated detector. A scattering pattern is formed at each scanning location. The scattering pattern may include multiple Kikuchi lines. The DBCI is constructed with the scattering patterns. Each pixel of the DBCI corresponds to one scanning location. The pixel value of the DBCI is the integration of signals along a selected diffraction band in the scattering pattern acquired at the scanning location. The diffraction band is selected to include at least a portion of a Kikuchi line in the scattering pattern. The image contrast of DBCI is generated from the channeling effect of the charged particles within the crystal lattice of a specific orientation (that is, a specific channeling condition) and may be used for detecting defect in sample's crystal structure.

In some embodiments, the charged particle imaging system is a scanning electron microscopy (SEM) system. In one example, the sample surface is positioned normal relative to the primary electron beam. In another example, the sample surface is positioned with a non-zero angle relative to the primary axis of the electron beam. For example, the angle may be less than 45 degrees. Backscattered electrons (BSE) from the sample may be collected by a position sensitive BSE detector arranged between the pole piece and the sample. An electron backscattered pattern (EBSP) is generated based on the BSE collected at a scanning location. The DBCI may be constructed by integrating the EBSP along a selected diffraction band within the EBSP. The diffraction band may be selected manually by the operator or automatically by the controller of the imaging system.

The diffraction band within the EBSP may include at least a portion of a Kikuchi line of the EBSP. Because an individual EBSP may not have sufficient contrast for identifying the Kikuchi line, the Kikuchi line can be identified from an integrated EBSP. The integrated EBSP is generated by integrating EBSPs of multiple scanning locations within a grain. A grain contains crystal structure with the same orientation, or in other words, the same distribution of Kikuchi lines/bands. Grain boundaries may be identified based on a sample image. In one example, the sample image is an SEM image. In another example, the sample image may be constructed by integrating all BSEs acquired corresponding to each scanning location, or in other words, by integrating pixels of the EBSP corresponding to each scanning location. If the field of view of the DBCI includes multiple grains, the location of a selected diffraction band is determined for each grain based on the integrated EBSPs generated for the grain. The diffraction band is selected to have a selective channeling condition. In one example, the diffraction band may be the entire Kikuchi line within the EBSP. In another example, the diffraction band may be a portion or several portions of the Kikuchi line within the EBSP. Different diffraction bands oriented differently in the EBSP, therefore includes electron channeling information at different crystal orientations. Multiple DBCIs of different diffraction bands may be generated to show different channeling conditions relative to the crystal orientation. Location of the crystal defect may be identified from the multiple DBCIs of the same sample.

In order to reduce radiation damage to the sample, the EBSPs may be acquired via frame integration. The multiple scanning locations may be scanned repetitively with a short dwell time. After each scan, the EBSP of each scanning location is updated by adding the newly acquired BSE frame to the current EBSP. The repetitive scan may be terminated when the quality of the acquired data is satisfied, such as, when the data quality is higher than a threshold data quality. The data quality may be measured by parameters such as the signal to noise ratio or image contrast. The acquired data may be grain boundary in sample image, Kikuchi lines/bands in the EBSP or integrated EBSP, or the DBCI.

In this way, DBCIs with different electron channeling conditions may be constructed based on the same set of the EBSPs. The EBSPs are acquired without tilting the sample relative to the incident beam. Further, high quality image may be acquired with minimal radiation damage to the sample.

Turning to FIG. 1, an example SEM system 10 capable of generating DBCIs is shown. The SEM system 10 may include an electron beam column 110 coupled to a sample chamber 120. The electron beam column 110 includes an electron source 102 for producing a beam of energetic electrons along primary axis 104. The electron beam may be manipulated by lenses (106, 108, 118), deflectors (112, 114), and beam limiting apertures (116) to form a finely focused spot on sample 126.

The sample chamber 120 may optionally comprise an airlock 122 for introducing the sample therein and placing the sample on sample holder 124. The sample holder 124 may rotate or translate/shift the sample so that the sample surface may be irradiated by the finely focused electron beam under a selectable tilt angle. The sample chamber 120 further includes one or more detectors for receiving particles emitted from the sample. The detectors may include the energy dispersive spectroscopy (EDS) detector 140 for detecting x-rays, the BSE detector 138 for detecting backscattered electrons, and the Everhart-Thornley detector 130 for detecting the secondary electrons. The SEM system may also include an electron backscatter diffraction (EBSD) detector (not shown). The BSE detector 138 may be a position sensitive detector. For example, responsive to an event of a single electron impinging the detector, data related to the event, such as the time of impact, the relative impact location on the detector, and the energy of the electron may be transmitted from the detector to the controller 132. The BSE detector may further filter the received electrons based on their energy. In one example, the BSE detector is a pixelated detector. The BSE detector may be positioned between the pole piece 150 of the electron beam column 110 and the sample holder 124. In some examples, the BSE detector may have a hole at the center to allow the electron beam passing through. The BSE detector may acquire a frame of the BSE responsive to irradiating a scanning location of the sample. Both the electron beam column 110 and the sample chamber 120 may be connected with high vacuum pump to evacuate the enclosed volumes.

In some embodiments, the voltages and/or currents needed for the working of the (magnetic or electrostatic) lenses and of the electron source are generated/controlled by the column controller 134, while the controller 132 generates deflection signals for the deflectors and samples the signals of the detectors. The controller 132 may be connected to a display unit 136 for displaying information, such as an image of the sample. The controller 132 may also receive operator inputs from the input device 141. The input device may be a mouse, a keyboard, or a touchpad. The controller may translate, shift, or tilt the sample relative to the incident beam by moving the sample holder 124. The controller 132 may scan the sample with the electron beam by adjusting the location that the electron beam impinges the sample via the deflectors 112 and/or 114.

The controller 132 may include a processor 135 and a non-transitory memory 137 for storing computer readable instructions. By executing the computer readable instructions stored in the non-transitory memory, the controller may implement the various methods disclosed herein. For example, the controller 132 may be configured to process the signals received from the BSE detector, and generate SEM image, EBSP, and DBCI of the sample. The controller 132 may also include field-programmable gate array (FPGA) configured to process signals received from various detectors.

Though a SEM system is described by way of example, it should be understood that the imaging system may be other types of charge-particle microscopy system, such as transmission electron microscopy (TEM), scanning transmission electron microscopy (STEM), or a dual beam tool such as a focused ion beam combined with scanning electron microscopy (FIB-SEM). The present discussion of the SEM system is provided merely as an example of one suitable imaging system for acquiring the backscatter electrons.

Figure 2:
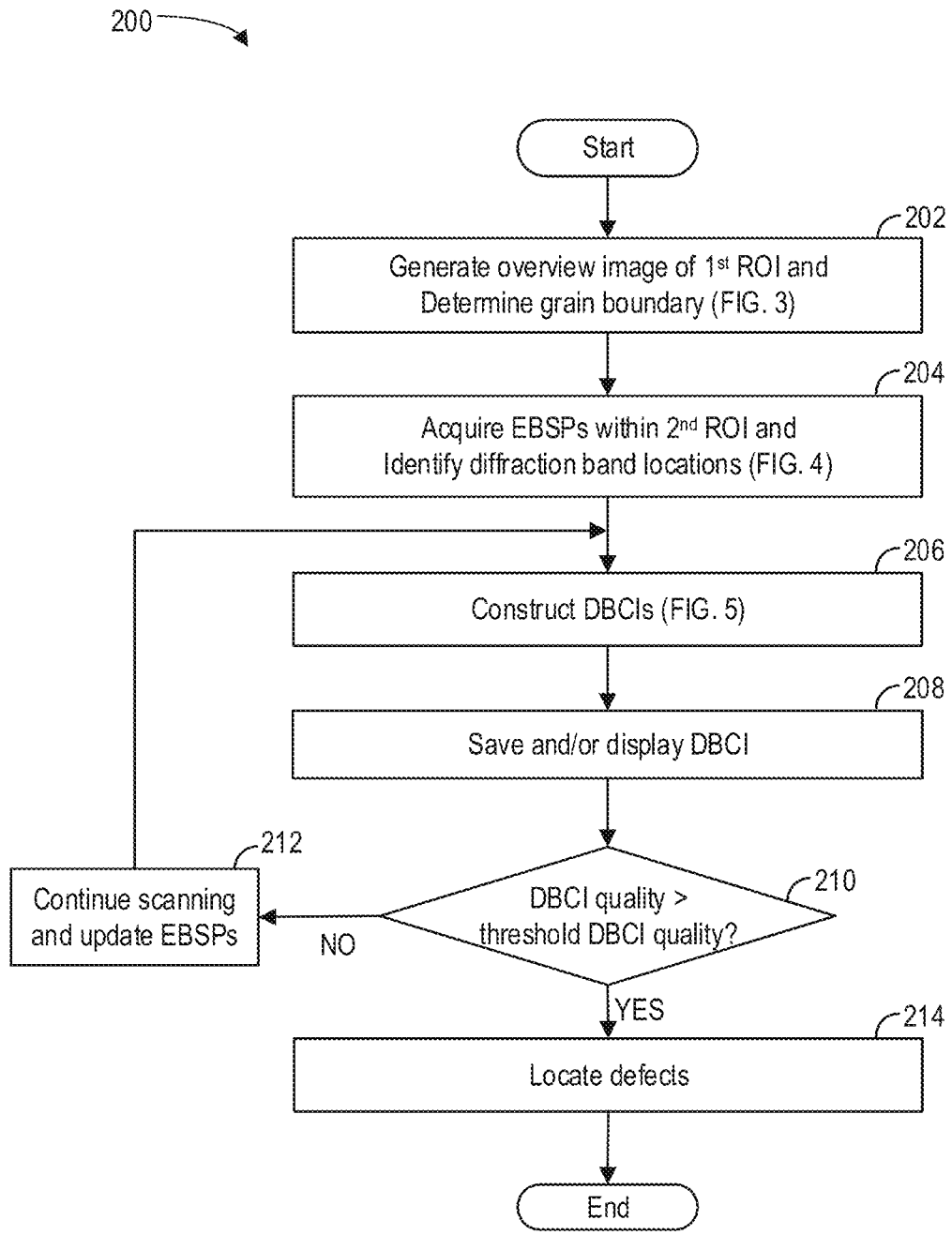
FIG. 2 is a high-level flow chart for generating the DBCI.

FIG. 2 is a top-level flowchart of method 200 for generating DBCIs using a charged particle system, such as the SEM system of FIG. 1. The DBCI with electron channeling contrast is constructed with the EBSPs acquired from the BSE detector, based on the location of a selected diffraction band of the EBSP. The DBCI may be updated and displayed in real-time during the EBSP acquisition. The sample is not tilted relative to the incident beam during the EBSP acquisition.

Figure 3:
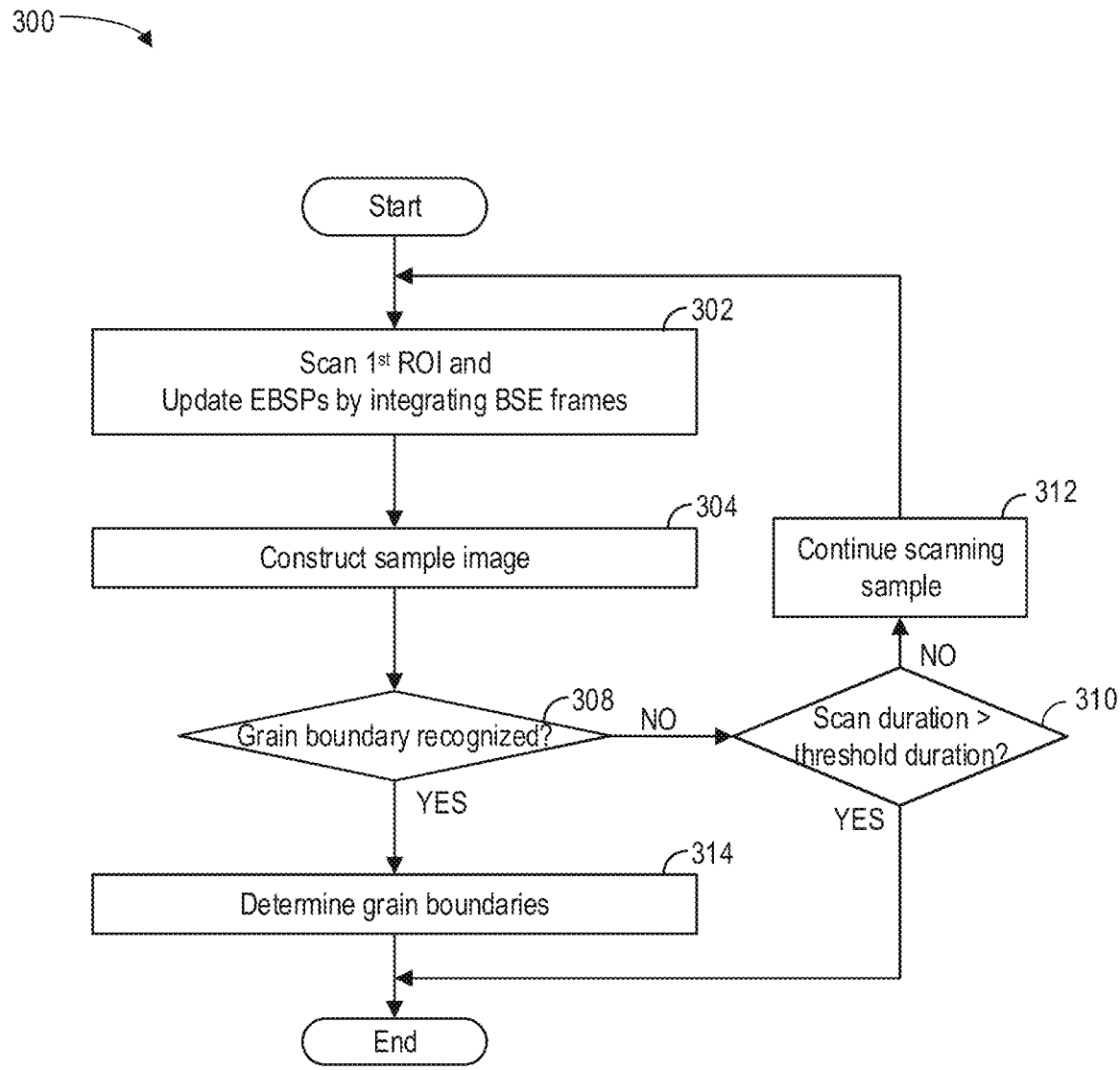
FIG. 3 shows a method for generating an overview sample image.

At 202, an overview image the sample is generated by scanning the first region of interest (ROI) with the electron beam, and grain boundaries within the first ROI may be identified in the overview image. The overview image may be a sample image showing structures of the sample. In one example, as shown in FIG. 3, the overview image is acquired by repetitively scanning the first ROI with a short dwell time at each scanning location and integrating the BSE frames until the grain boundaries can be identified. In another example, the overview image may be a conventional SEM image acquired via a single scan of the first ROI. In yet another example, the sample image is acquired by a detector different from the BSE detector.

In some embodiments, the grain boundaries may be identified by comparing the acquired EBSPs at different scanning location. Changes in the EBSPs may indicate whether the corresponding scanning locations belong to different grains. For example, a first EBSP and a second EBSP are acquired at a first scanning location and a second scanning location, respectively. Difference between the first and the second EBSPs is calculated and compared to a threshold difference. If the difference is greater than the threshold difference, the first and the second scanning locations belongs to different grains. In other words, if the difference between the EBSPs is greater than the threshold difference, a grain boundary locates between the first and the second scanning locations.

Figure 4:
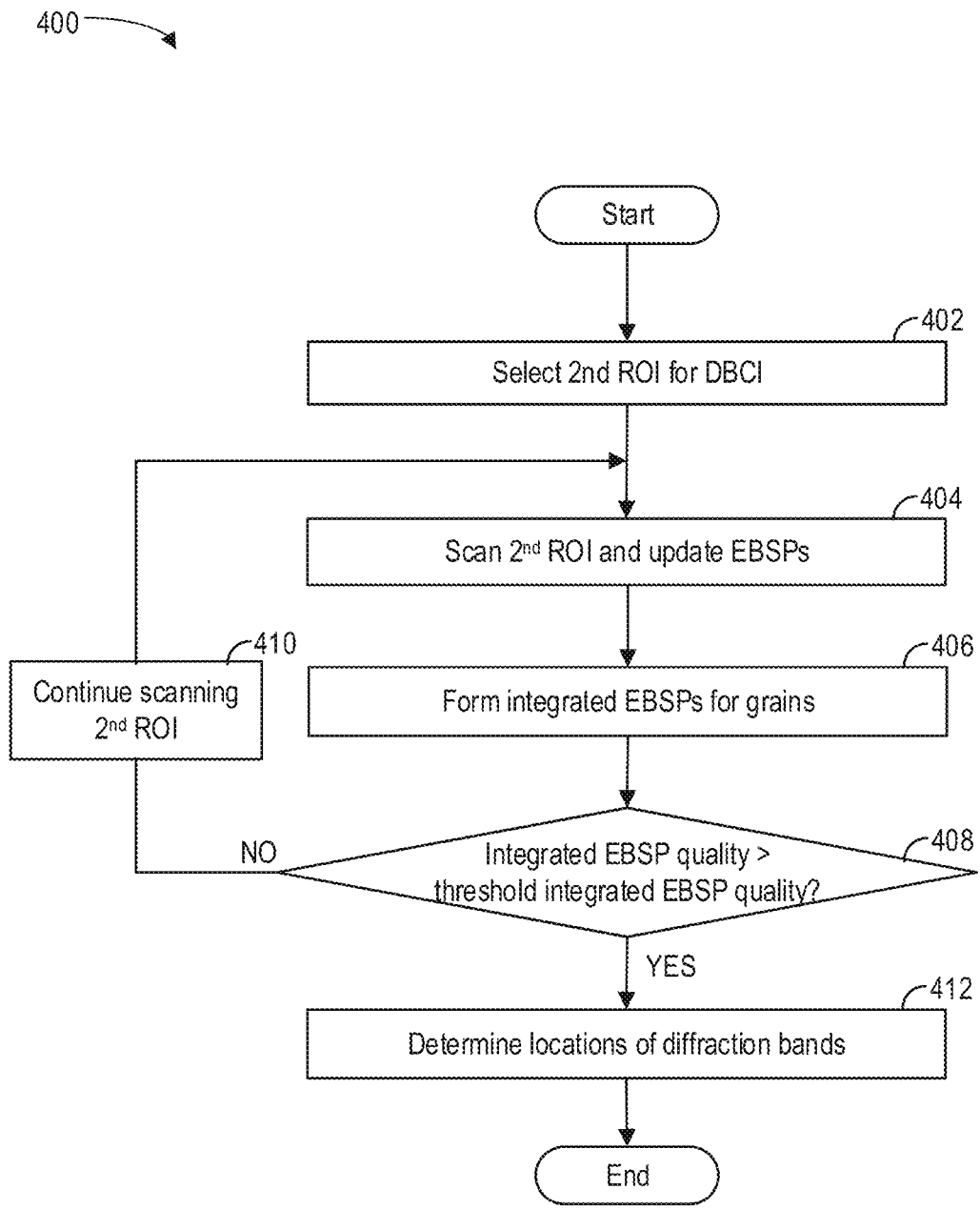
FIG. 4 shows a method for acquiring electron backscatter patterns (EBSPs) that are used for constructing the DBCI.

At 204, EBSPs at each scanning location of the second ROI are acquired, and diffraction band locations are identified based on an integrated EBSP. The integrated EBSP is generated by integrating EBSPs of the same grain to increase the contrast of Kikuchi lines/bands of the scattering pattern. Details for acquiring the EBSPs and identifying the diffraction band locations are shown in FIG. 4.

The second ROI may be within the first ROI. In one example, the second ROI is a connected region within the first ROI. In another example, the second ROI includes multiple disconnected regions within the first ROI. The second ROI may include selective grains identified in step 202. The second ROI may be scanned at a higher resolution comparing to the first ROI. In other words, the scanning step size between at least some of the adjacent scanning locations is smaller in the scan of the second ROI comparing to the scan of the first ROI at 202. If any of the scanning locations of the second ROI are the same as the scanning locations of the first ROI (that is, scanning locations are duplicated), the EBSPs acquired at the duplicated scanning locations in step 202 may be used in step 204.

Figure 5:
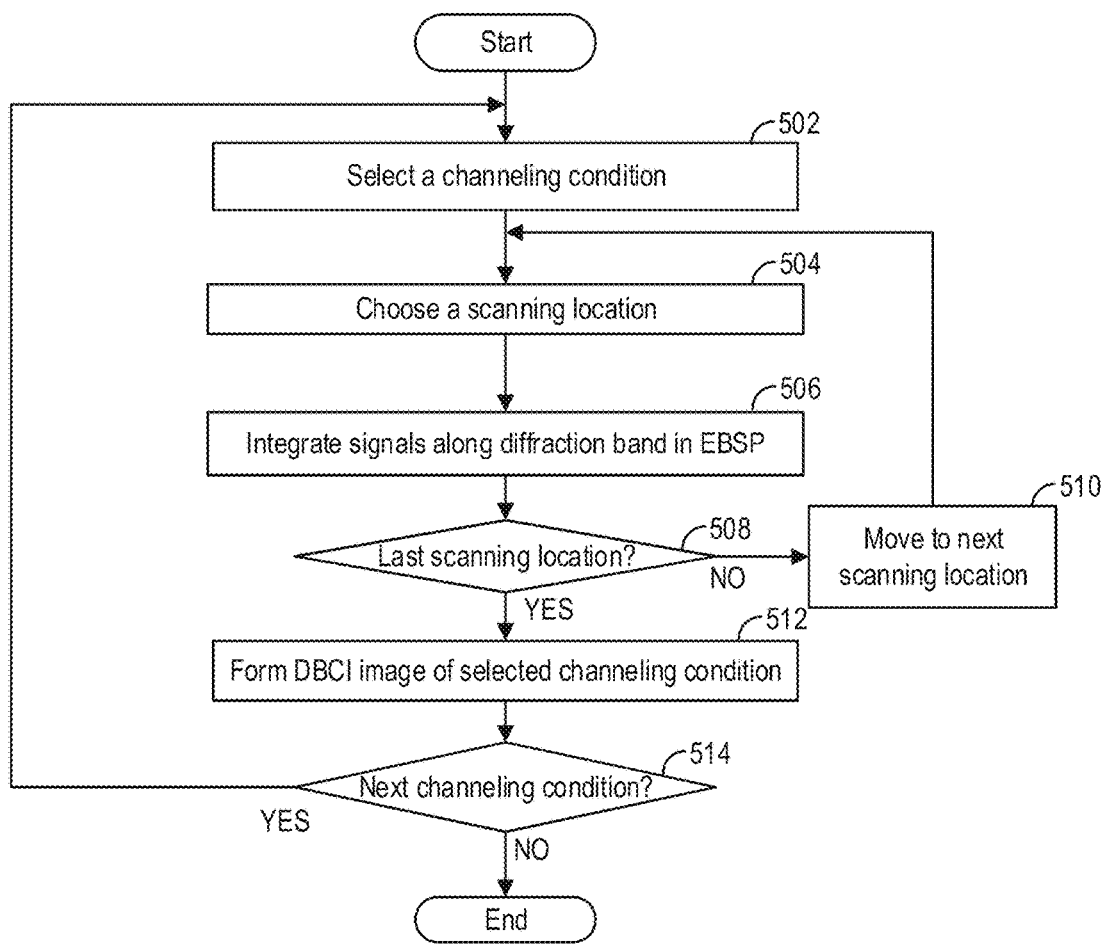
FIG. 5 shows a method for constructing the DBCI.

At 206, the DBCIs of various channeling conditions are constructed with the EBSPs of the second ROI. Each pixel of the DBCI is calculated by integrating the EBSP pixels along a diffraction band corresponding to a selected channeling condition. Details of the DBCI constructions are shown in FIG. 5.

At 208, the DBCIs are saved or displayed on the screen. If more EBSPs are acquired, the DBCIs may be updated with the newly acquired EBSPs, and the updated DBCIs are displayed. As such, the operator may monitor the data acquisition process and assess the data quality in real-time.

At 210, quality of the DBCIs are assessed. The DBCI quality may be measured based on parameters such as the image contrast and the signal to noise ratio. The DBCI quality may alternatively be measured based on the visibility of the sample defects. If the DBCI quality is higher than a threshold DBCI quality, the crystal defects in sample may be located at 214. Otherwise, if the DBCI quality is not higher than a threshold DBCI quality, at 212, the second ROI is continuously scanned and the EBSPs are updated. The DBCIs are then constructed based on the updated EBSP.

In some examples, DBCI quality of each grain (or a sub-region of the second ROI) may be assessed individually. Responsive to the DBCI quality of a particular grain (or the sub-region) lower than the threshold DBCI quality, only the grain (or the sub-region) with low DBCI quality is rescanned at 212. As such, only low quality DBCIs (or a low quality region of a DBCI) are updated subsequently.

In some embodiments, instead of comparing the DBCI quality with the threshold DBCI quality. The operator may determine whether to continue the scan of the second ROI based on the displayed DBCIs. For example, the operator may terminate the scan responsive to the sample defects visible in the DBCIs.

In this way, DBCIs showing different electron channeling conditions are constructed with the EBSPs of the ROI. Comparing to the traditional ECCI, similar electron channeling information may be obtained without tilting the sample relative to the incident beam. The duration and complexity of the data acquisition process are greatly reduced. Moreover, DBCIs of different channeling conditions can be displayed and updated in real-time during EBSP acquisition, which reduces unnecessary data acquisition and sample radiation damage.

FIG. 3 shows an example method 300 for generating the sample image using the BSE detector. The sample image may be acquired by repetitively scanning the first ROI until the grain boundaries can be identified.

At 302, multiple scanning locations within the first ROI are scanned with a short dwell time. Responsive to irradiating each scanning location with the electron beam, a frame of BSE is acquired with the BSE detector positioned between the deflector and the sample. In some examples, the pixelated detector may include an electron energy filtering function, and the acquired BSE may be BSE with an electron energy higher than a threshold energy level. Step 302 may include initiating EBSPs for each scanning location. For example, the EBSPs may be initiated by setting each pixel of the EBSPs to zero. After each scan of the ROI, the EBSP is updated by integrating the newly acquired frame with the current EBSP. For example, at each scanning location, multiple BSE frames acquired during multiple scans of the scanning location are summed up. In other words, signals received at each pixel of the detector during multiple scans are summed up. Integrating BSE frames may include averaging or normalizing the BSE frames.

At 304, sample image of the first ROI is constructed with the updated EBSPs. For example, each pixel of the sample image is obtained by summing up the BSE acquired at the corresponding scanning location. In other words, each pixel of the sample image is obtained by summing up all pixels in the corresponding EBSP. The sample image resembles a conventional SEM image and shows structures of the sample.

At 308, method 300 determines whether the grain boundaries within the first ROI can be recognized or identified in the constructed sample image. The grain boundaries may be automatically identified by Orientation Imaging Microscopy. In another example, the sample image may be displayed to the operator, and the operator determines whether the grain boundaries can be identified. In yet another example, instead of determining the grain boundaries based on the constructed sample image, the grain boundaries may be determined based on changes of the EBSPs. For example, two scanning locations belonging to different grains if the difference between the corresponding EBSPs is greater than the threshold difference. If the grain boundary can be recognized, the grain boundaries are determined and saved at 314. Otherwise, if the grain boundary cannot be recognized, method 300 moves to 310.

At 310, if the total scan duration exceeds a threshold duration, method 300 exits. Otherwise, the first ROI is continuously scanned at 312.

FIG. 4 shows method 400 for acquiring EBSPs for generating the DBCIs. The diffraction band locations of each EBSP are determined from the integrated EBSP.

At 402, the second ROI for DBCI is selected. The second ROI may be within the first ROI. In some examples, the second ROI is the same as the first ROI. The second ROI may be selected based on the grain boundaries identified in the first ROI. For example, one or more grains in the first ROI may be selected as the second ROI for further analysis.

At 404, multiple scanning locations in the second ROI are scanned with the electron beam and the EBSPs are updated based on the received BSE. The scanning locations of the second ROI may be denser than the scanning locations of the first ROI. The EBSPs may be initiated to be zero, wherein one scanning location corresponds to one EBSP. The dimension of each EBSP is the same as the dimension of the pixelated detector. Similar to step 302 of method 300, after irradiating a scanning location, a BSE frame is acquired. The EBSP corresponding to the scanning location is updated by integrating the newly acquired BSE frame to the current EBSP.

At 406, integrated EBSP is formed for each grain. The integrated EBSP may be formed by integrating, such as summing up, at least some of the EBSPs belonging to the same grain. By integrating EBSPs, contrast of the scattering pattern, such as the Kikuchi lines in the integrated EBSP, is increased.

At 408, quality of the integrated EBSP is compared with a threshold integrated EBSP quality. Quality of the integrated EBSP may be assessed based on parameters such has image contrast and signal to noise ratio. If the quality of the integrated EBSP is lower than the threshold integrated EBSP quality, the second ROI is scanned again at 410, and the integrated EBSP is updated. If the quality of the integrated EBSP is higher than the threshold integrated EBSP quality, Kikuchi lines can be identified in the integrated EBSP, and locations of the diffraction bands can be determined in the integrated EBSP at 412.

At 412, location of diffraction bands in each of the EBSP is determined. Location of the diffraction bands in the EBSP is the same as the diffraction band location in the corresponding integrated EBSP. Each diffraction band is aligned with a different Kikuchi line of the integrated EBSP, and represents a different channeling condition. In some embodiments, the Kikuchi lines are the low intensity lines on either side of a high intensity Kikuchi band. The diffraction band may be a portion of the Kikuchi line. For example, the diffraction band may be the portion of the Kikuchi line that does not intercept with other Kikuchi lines. By selecting portions of the Kikuchi line to be the diffraction band, crosstalk between different diffraction conditions may be avoided. The width of the diffraction band may be 2-4 pixels.

FIG. 5 shows method 500 for constructing DBCIs of selected channeling conditions with EBSPs.

At 502, a channeling condition is selected. The channeling condition corresponds to a diffraction band in the EBSP. Once the channeling condition is selected, specific diffraction band in the EBSP is selected. For EBSPs belonging to different grains, locations of the diffraction bands of the same channeling condition may be different.

For the scanning location chosen at 504, EBSP signals along the selected diffraction band are integrated, such as summed, to generate the pixel value of the DBCI at the scanning location. For example, the grain containing the scanning location is first identified. Then, location of the selected diffraction band in the integrated EBSP of the identified grain is obtained. Location of the selected diffraction band in the EBSP is the same as the location of the selected diffraction band in the integrated EBSP of the identified grain. After all scanning locations in the second ROI are processed, the DBCI image of the selected channeling condition is formed at 512. Otherwise, method 500 moves to the next scanning location at 510.

At 514, method 500 checks whether all selected channeling conditions are processed. If the DBCI of another channeling condition needs to be constructed, method 500 moves to 502. Otherwise, method 500 exits.

In some embodiments, different grains in the DBCI may have different channeling conditions. That is, the diffraction bands of at least two grains in the DBCI are along Kikuchi lines of different crystal orientations. However, for each pixel within a single grain of the DBCI, the channeling condition is the same.

Figure 6:
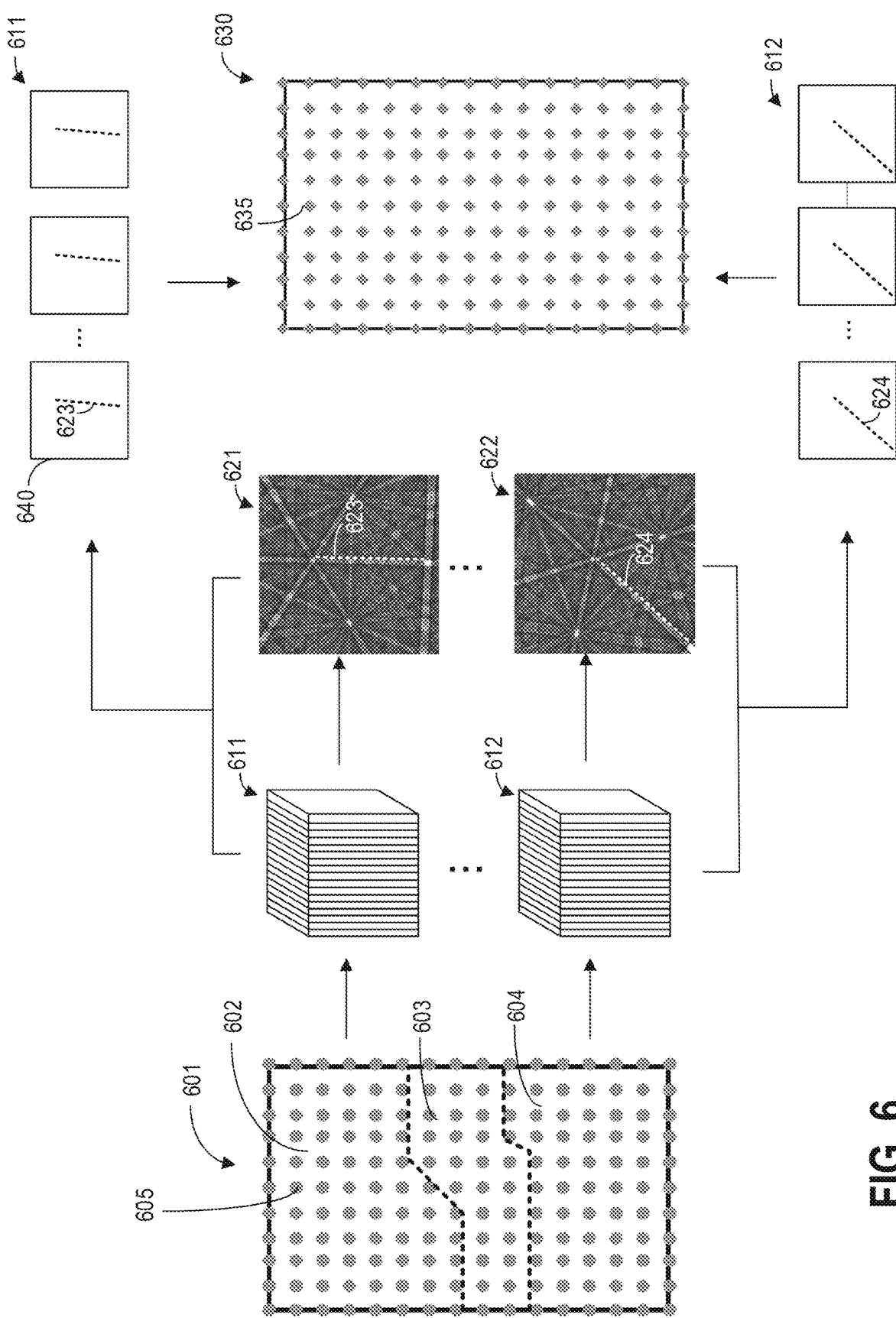
FIG. 6 illustrates procedures for constructing the DBCI.

FIG. 6 illustrates the procedures to construct the DBCI 630 from the EBSPs acquired from ROI 601. ROI 601 may be the second ROI of FIG. 2. Solid circles of the ROI 610 represent the scanning locations. Dashed lines within the ROI represent grain boundaries. Grain boundaries may be identified from the overview image of the first ROI of FIG. 2. Alternatively, grain boundaries may be identified based on the BSEs received during the scan of ROI 601. ROI 601 includes three grains (602, 603, and 604). EBSPs of the scanning locations within each grain are integrated into an integrated EBSP. EBSPs 611 are acquired from scanning locations of grain 602, and EBSPs 612 are acquired from scanning locations of grain 604. EBSPs 611 are integrated into integrated EBSP 621, and EBSPs 612 are integrated into integrated EBSP 622. The integrated EBSP 621 and integrated EBSP 622 are different. A diffraction band along Kikuchi line of a particular channeling condition is selected. Location of diffraction band 623 in integrated EBSP 621 and location of diffraction band 624 in integrated EBSP 622 are determined. For grain 602, the locations of the selected diffraction band 623 in the integrated EBSP 621 and in each of the EBSPs 611 are the same. Similarly, for grain 604, the locations of the selected diffraction band 624 in the integrated EBSP 622 and in each of the EBSPs 612 are the same. Pixel values along the selected diffraction band are summed up to generate the pixel value of DBCI. For example, EBSP 640 is acquired at scanning location 605 within grain 602. Pixel values along diffraction band 623 are summed up to generate the pixel value of the corresponding pixel 635 in the DBCI 630.

Figure 7:
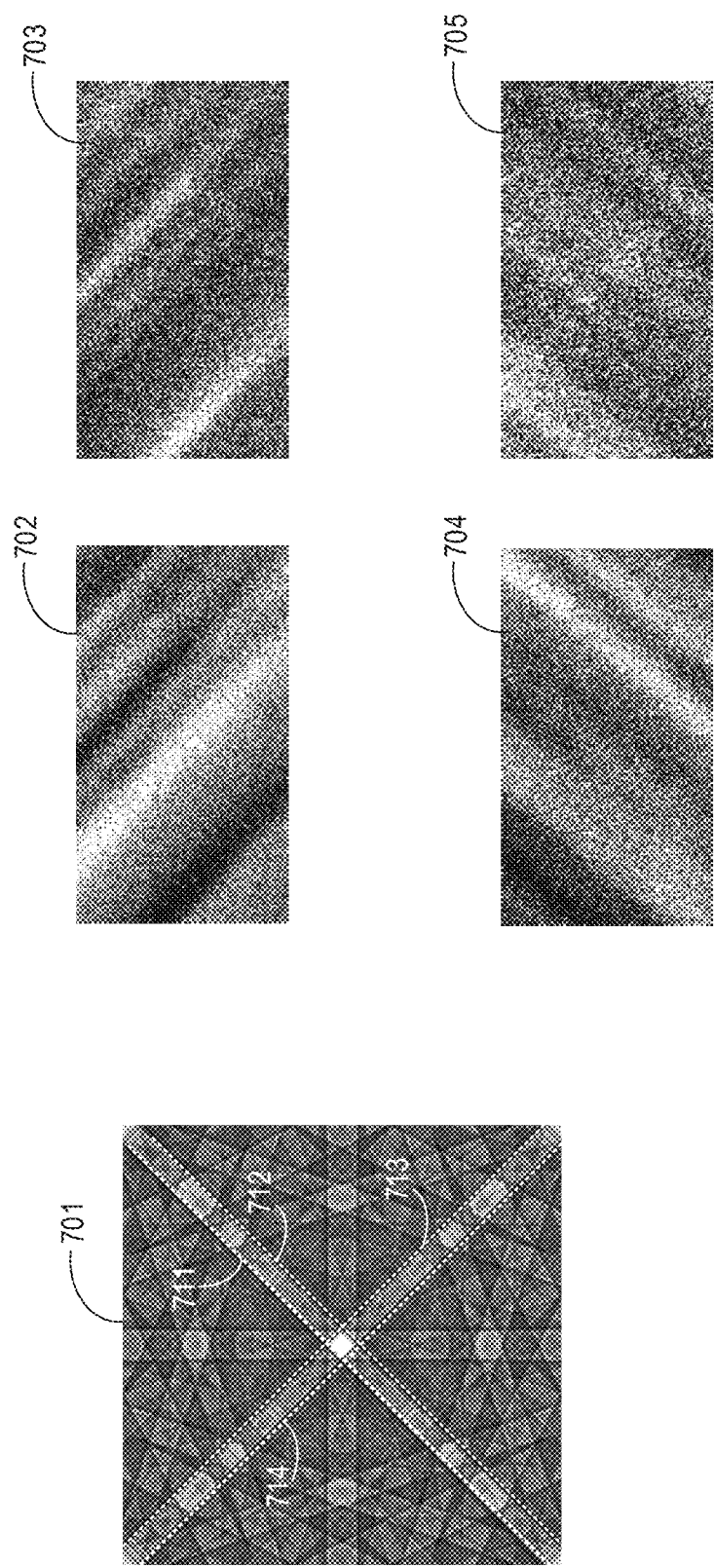
FIG. 7 shows an example of integrated EBSP and the corresponding DBCIs.

FIG. 7 shows example DBCIs of different diffraction channeling conditions of a sample contains a single grain. Locations of four diffraction bands 711-714 in the integrated EBSP 701 are determined based on the selected channeling conditions. Each of the diffraction band is aligned with a different Kikuchi line. Diffraction bands 711, 712, 713 and 714 represent channeling conditions along crystal orientation (−220), (2-20), (220) and (−2-20), respectively. DBCIs 702, 703, 704 and 705 are generated by integrating the EBSP signals along the diffraction bands 711, 712, 713 and 714, respectively. The DBCIs 702-705 are different, which reflect different electron channeling effects in different crystal orientation.

The technical effect of constructing the DBCI with the EBSPs based on the selected diffraction band is that the electron channeling effect can be visualized without tilting the sample relative to the incident electron beam. The technical effect of forming the integrated EBSP is that Kikuchi line can be identified in the integrated EBSP even though the image contrast of individual EBSP is low. The technical effect of integrating the EBSP along the diffraction band to form the DBCI is that BSEs received under specific diffraction conditions are extracted. The technical effect of updating the DBCI while repetitively scan the sample is to reduce sample radiation damage. Further, it enables acquisition of high quality data with reduced duration.

In one embodiment, a method for imaging a sample comprises scanning a plurality of scanning locations of the sample with a charged particle beam; acquiring charged particles emitted from the sample; forming a plurality of scattering patterns with the acquired charged particles, wherein one scattering pattern is formed at each scanning location of the plurality of scanning locations; determining a location of a diffraction band in the plurality of scattering patterns; and constructing a dynamic band contrast image (DBCI) from the plurality of scattering patterns based on the location of the diffraction band. In a first example of the method, the method further includes determining a grain boundary of at least one grain of the sample; and wherein determining the location of the diffraction band in the plurality of scattering patterns includes determining the location of the diffraction band by integrating the plurality of scattering patterns within the grain boundary. A second example of the method optionally includes the first example and further includes forming a sample image by integrating the acquired charged particles from each of the plurality of scanning locations, and wherein determining the grain boundary includes determining the grain boundary based on the sample image. A third example of the method optionally includes one or more of the first and second examples, and further includes scanning a region of interest with the charged particle beam; forming a sample image with charged particles emitted from the region of interest, and wherein determining the grain boundary includes determining the grain boundary based on the sample image. A fourth example of the method optionally includes one or more of the first to the third examples, and further includes, wherein selecting a diffraction band based on the plurality of scattering patterns includes: forming an integrated scattering pattern based on the plurality of scattering patterns; and selecting the diffraction band by selecting at least a portion of a Kikuchi line of the integrated scattering pattern. A fifth example of the method optionally includes one or more of the first to the fourth examples, and further includes responsive to a quality of the DBCI lower than a threshold quality level, updating the plurality of scattering patterns by rescanning the plurality of scanning locations; and updating the DBCI based on the updated plurality of scattering patterns and the selected diffraction band. A sixth example of the method optionally includes one or more of the first to the fifth examples, and further includes, wherein the plurality of scanning locations belong to multiple grains, wherein determining the location of the diffraction band in the plurality of scattering patterns includes selecting the diffraction band for each grain of the multiple grains based on the plurality of scattering patterns of the grain, and wherein constructing the DBCI based on the plurality of scattering patterns and the location of the diffraction band includes constructing the DBCI based on the plurality of scattering patterns and corresponding selected diffraction bands of the multiple grains. A seventh example of the method optionally includes one or more of the first to the sixth examples, and further includes determining a location of a second diffraction band in the plurality of scattering patterns, constructing a second DBCI based on the plurality of scattering patterns and the location of the second diffraction band. A eighth example of the method optionally includes one or more of the first to the seventh examples, and further includes, wherein the second diffraction band has a different channeling condition from the diffraction band.

In one embodiment, a method for imaging a sample comprises continuously scanning a plurality of scanning locations of the sample with a charged particle beam; during each scan, updating a plurality of scattering patterns based on accumulated backscattered charged particles from the sample, wherein each scattering pattern of the plurality of scattering patterns corresponds to one of the plurality of scanning locations; determining a location of a diffraction band in the plurality of scattering patterns; and updating a dynamic band contrast image (DBCI) with signals from the plurality of scattering patterns and the location of the diffraction band. In a first example of the method, the method further includes, wherein updating the DBCI with signals from the plurality of scattering patterns and the location of the diffraction band includes updating a particular pixel of the DBCI by integrating signals along the diffraction band of the scattering pattern that corresponds to the pixel. A second example of the method optionally includes the first example and further includes, wherein determining the location of the diffraction band in the plurality of scattering patterns includes forming an integrated scattering pattern by summing up the plurality of scattering patterns, and determining the location of the diffraction band relative to the plurality of scattering patterns based on Kikuchi lines in the integrated scattering pattern. A third example of the method optionally includes one or more of the first and second examples, and further includes, wherein the diffraction band is arranged along one of the Kikuchi lines in the integrated scattering pattern. A fourth example of the method optionally includes one or more of the first to the third examples, and further includes, terminating scanning the plurality of scanning locations responsive to a quality of the DBCI higher than a threshold quality level.

In one embodiment, a system for imaging a sample comprises a charged particle source for generating a charged particle beam along a primary axis; a sample holder for holding the sample; a deflector for scanning the charged particle beam over the sample; a detector positioned between the deflector and the sample holder for collecting backscattered charged particles from the sample; and a controller including a non-transitory memory, wherein the non-transitory memory stores instructions, that when executed by the controller, causes the controller to: scan a plurality of scanning locations of the sample with the charged particle beam; form a plurality of scattering patterns based on charged particles emitted from the sample, wherein at least one of the scattering pattern is formed at each scanning location of the plurality of scanning locations; select a diffraction band based on the plurality of scattering patterns; and construct a dynamic band contrast image (DBCI) based on the plurality of scattering patterns and the selected diffraction band. In a first example of the system, the system further includes, wherein the detector is a position sensitive detector. A second example of the system optionally includes the first example and further includes, wherein the non-transitory memory stores further instructions, that when executed by the controller, causes the controller to acquire a sample image; and select the plurality of scanning locations based on the sample image. A third example of the system optionally includes one or more of the first and second examples, and further includes, wherein the sample is not tilted relative to the primary axis while scanning the plurality of scanning locations. A fourth example of the system optionally includes one or more of the first to the third examples, and further includes, wherein the non-transitory memory stores further instructions, that when executed by the controller, causes the controller to select a second, different, diffraction band, and construct a second DBCI based on the plurality of scattering patterns and the second diffraction band. A fifth example of the system optionally includes one or more of the first to the fourth examples, and further includes, wherein the non-transitory memory stores further instructions, that when executed by the controller, causes the controller to locate sample defect based on the DBCI.

What is claimed is:

1. A method for imaging a sample, comprising:
scanning a plurality of scanning locations of the sample with a charged particle beam;
acquiring charged particles emitted from the sample;
forming a plurality of scattering patterns with the acquired charged particles, wherein one scattering pattern is formed at each scanning location of the plurality of scanning locations;
forming an integrated scattering pattern based on the plurality of scattering patterns;
determining a location of a diffraction band in the plurality of scattering patterns based on Kikuchi lines in the integrated scattering pattern; and
constructing a dynamic band contrast image (DBCI) from the plurality of scattering patterns based on the location of the diffraction band.

2. The method of claim 1, further comprising determining a grain boundary of at least one grain of the sample; and wherein determining the location of the diffraction band in the plurality of scattering patterns includes determining the location of the diffraction band by integrating the plurality of scattering patterns within the grain boundary.

3. The method of claim 2, further comprising forming a sample image by integrating the acquired charged particles from each of the plurality of scanning locations, and wherein determining the grain boundary includes determining the grain boundary based on the sample image.

4. The method of claim 2, further comprising scanning a region of interest with the charged particle beam; forming a sample image with charged particles emitted from the region of interest, and wherein determining the grain boundary includes determining the grain boundary based on the sample image.

5. The method of claim 1, further comprising: responsive to a quality of the DBCI lower than a threshold quality level, updating the plurality of scattering patterns by rescanning the plurality of scanning locations; and updating the DBCI based on the updated plurality of scattering patterns and the selected diffraction band.

6. The method of claim 1, wherein the plurality of scanning locations belong to multiple grains, wherein determining the location of the diffraction band in the plurality of scattering patterns includes selecting the diffraction band for each grain of the multiple grains based on the plurality of scattering patterns of the grain, and wherein constructing the DBCI based on the plurality of scattering patterns and the location of the diffraction band includes constructing the DBCI based on the plurality of scattering patterns and corresponding selected diffraction bands of the multiple grains.

7. The method of claim 1, further comprising determining a location of a second diffraction band in the plurality of scattering patterns, constructing a second DBCI based on the plurality of scattering patterns and the location of the second diffraction band.

8. The method of claim 7, wherein the second diffraction band has a different channeling condition from the diffraction band.

9. A method for imaging a sample, comprising:
continuously scanning a plurality of scanning locations of the sample with a charged particle beam;
during each scan, updating a plurality of scattering patterns based on accumulated backscattered charged particles from the sample, wherein each scattering pattern of the plurality of scattering patterns corresponds to one of the plurality of scanning locations;
determining a location of a diffraction band in the plurality of scattering patterns;
updating a dynamic band contrast image (DBCI) with signals from the plurality of scattering patterns and the location of the diffraction band; and
terminating scanning the plurality of scanning locations responsive to a quality of the DBCI higher than a threshold quality level.

10. The method of claim 9, wherein updating the DBCI with signals from the plurality of scattering patterns and the location of the diffraction band includes updating a particular pixel of the DBCI by integrating signals along the diffraction band of the scattering pattern that corresponds to the pixel.

11. The method of claim 9, wherein determining the location of the diffraction band in the plurality of scattering patterns includes forming an integrated scattering pattern by summing up the plurality of scattering patterns, and determining the location of the diffraction band relative to the plurality of scattering patterns based on Kikuchi lines in the integrated scattering pattern.

12. The method of claim 11, wherein the diffraction band is arranged along one of the Kikuchi lines in the integrated scattering pattern.

13. A system for imaging a sample, comprising:
a charged particle source for generating a charged particle beam along a primary axis;
a sample holder for holding the sample;
a deflector for scanning the charged particle beam over the sample;
a detector positioned between the deflector and the sample holder for collecting backscattered charged particles from the sample; and
a controller including a non-transitory memory, wherein the non-transitory memory stores instructions, that when executed by the controller, causes the controller to:
scan a plurality of scanning locations of the sample with the charged particle beam;
form a plurality of scattering patterns based on charged particles emitted from the sample, wherein at least one of the scattering pattern is formed at each scanning location of the plurality of scanning locations;
form an integrated scattering pattern based on the plurality of scattering patterns;
select a diffraction band by selecting at least a portion of a Kikuchi line of the integrated scattering pattern; and
construct a dynamic band contrast image (DBCI) based on the plurality of scattering patterns and the selected diffraction band.

14. The system of claim 13, wherein the detector is a position sensitive detector.

15. The system of claim 13, wherein the non-transitory memory stores further instructions, that when executed by the controller, causes the controller to acquire a sample image; and select the plurality of scanning locations based on the sample image.

16. The system of claim 13, wherein the sample is not tilted relative to the primary axis while scanning the plurality of scanning locations.

17. The system of claim 13, wherein the non-transitory memory stores further instructions, that when executed by the controller, causes the controller to select a second, different, diffraction band, and construct a second DBCI based on the plurality of scattering patterns and the second diffraction band.

18. The system of claim 13, wherein the non-transitory memory stores further instructions, that when executed by the controller, causes the controller to locate sample defect based on the DBCI.

* * * * *